(12) United States Patent
Chan

(10) Patent No.: US 10,825,942 B2
(45) Date of Patent: Nov. 3, 2020

(54) SOLAR CELL HERMETIC PACKAGE STRUCTURE

(71) Applicant: NANOBIT TECH. CO., LTD., Taoyuan (TW)

(72) Inventor: Te-Fong Chan, Taoyuan (TW)

(73) Assignee: NANOBIT TECH. CO., LTD., Taoyuan (TW)

( * ) Notice: Subject to any disclaimer, the term of this patent is extended or adjusted under 35 U.S.C. 154(b) by 0 days.

(21) Appl. No.: 16/411,110

(22) Filed: May 13, 2019

(65) Prior Publication Data

US 2020/0266311 A1  Aug. 20, 2020

(30) Foreign Application Priority Data

Feb. 19, 2019 (TW) .............................. 108202096 U

(51) Int. Cl.
*H01L 31/048* (2014.01)
*H01L 31/0224* (2006.01)

(52) U.S. Cl.
CPC .... *H01L 31/048* (2013.01); *H01L 31/022425* (2013.01)

(58) Field of Classification Search
None
See application file for complete search history.

(56) References Cited

U.S. PATENT DOCUMENTS

2013/0164466 A1* 6/2013 Khadilkar ............... B32B 37/12
428/34.5
2014/0099746 A1* 4/2014 Furihata ................ H01L 31/048
438/64
2016/0013342 A1* 1/2016 Koide .................. H01L 31/036
136/259

FOREIGN PATENT DOCUMENTS

JP 2012069986 A * 4/2012 ............. B32B 37/04

OTHER PUBLICATIONS

Partial translation of JP 2012069986, Isaki et al. (Year: 2020).*

* cited by examiner

*Primary Examiner* — Magali P Slawski
(74) *Attorney, Agent, or Firm* — Chun-Ming Shih; HDLS IPR Services

(57) ABSTRACT

A solar cell hermetic package structure includes a lower-cover plate, a conductive layer, a photovoltaic layer, a lower-electrode lead, an upper-electrode lead, an upper-cover plate, a border and dividers. The conductive layer and the photovoltaic layer are orderly arranged on one side of the lower-cover plate. The upper-electrode lead and the lower-electrode lead are arranged on the lower-cover plate and electrically connected to the photovoltaic layer and the conductive layer. The border is arranged on corresponding side edges of the lower-cover plate and the upper-cover plate. After the upper-cover plate and the lower-cover plate are combined, the photovoltaic layer is arranged in a hermetic package structure between the upper-cover plate and the lower-cover plate. A hermetic area accommodating the photovoltaic layer is formed by the border. The dividers are arranged in gaps of photovoltaic components and used as supports between the upper-cover plate and the lower-cover plate.

20 Claims, 4 Drawing Sheets

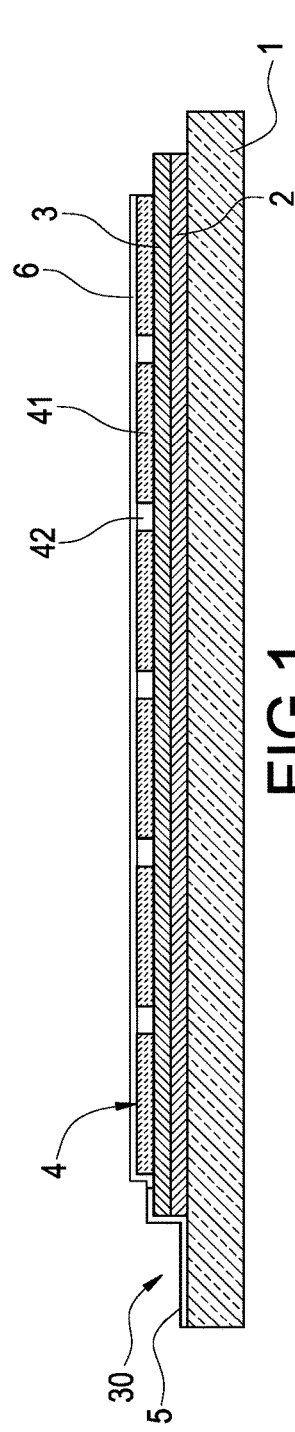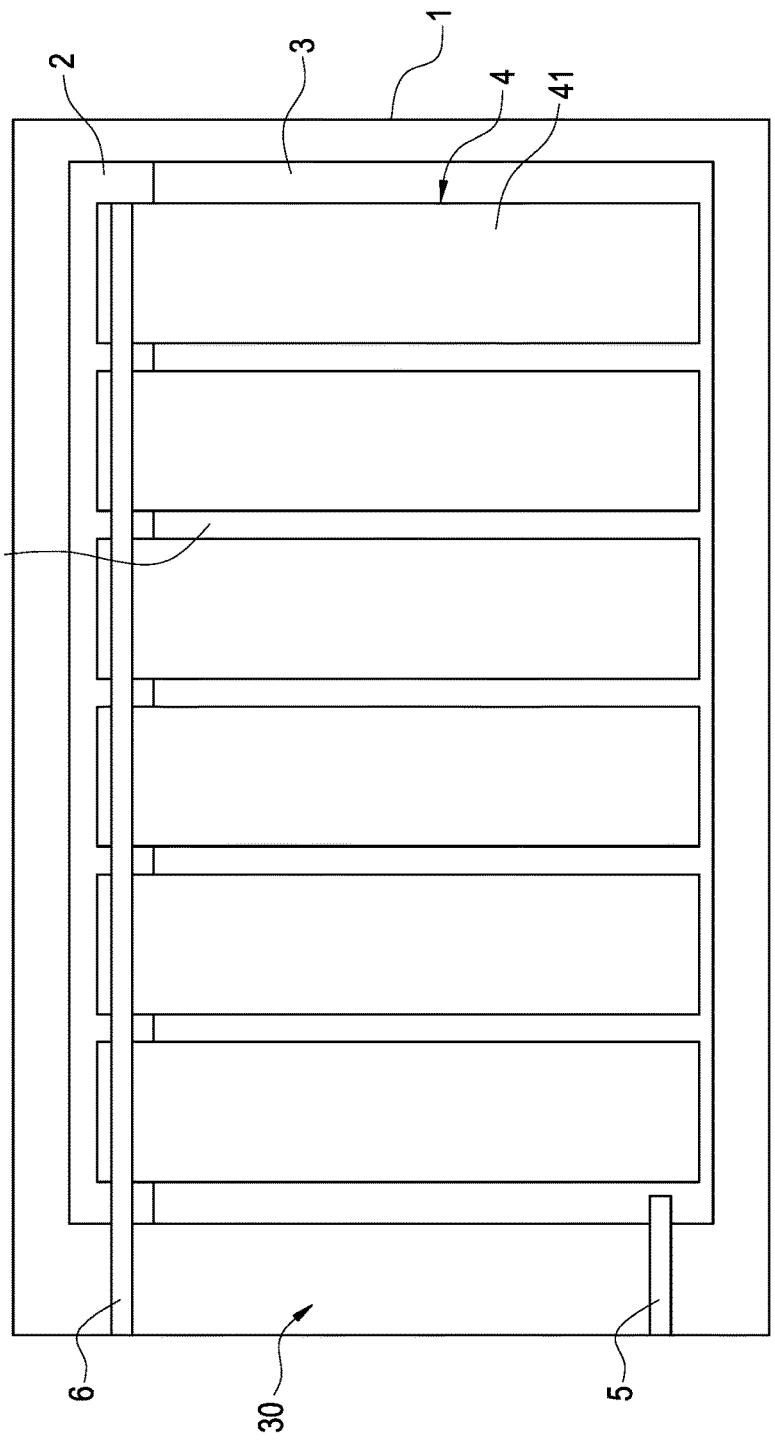

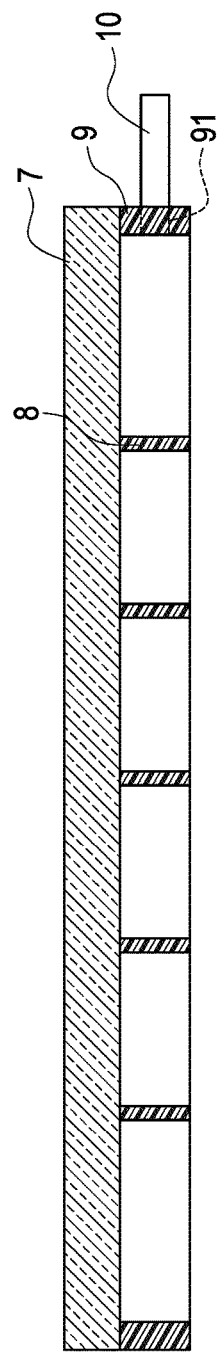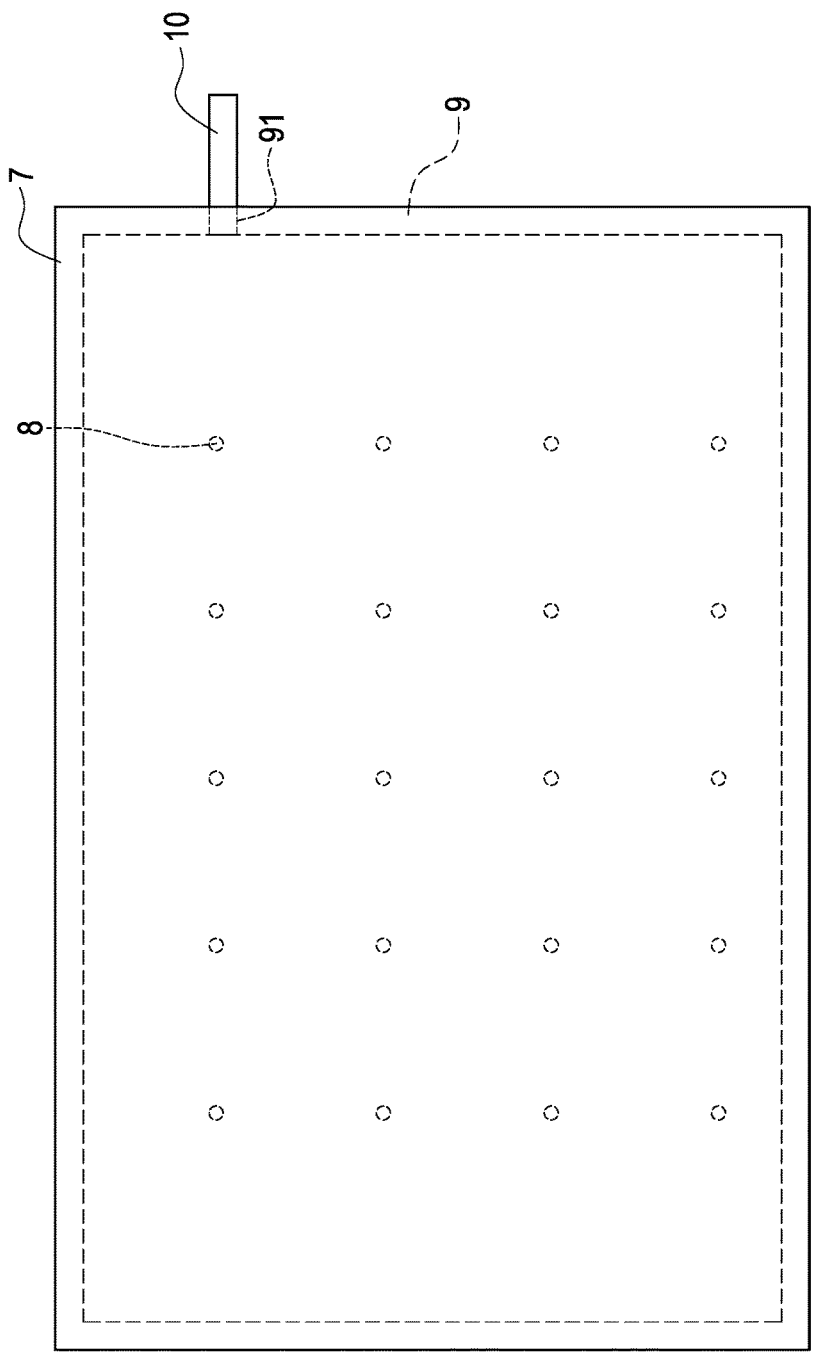

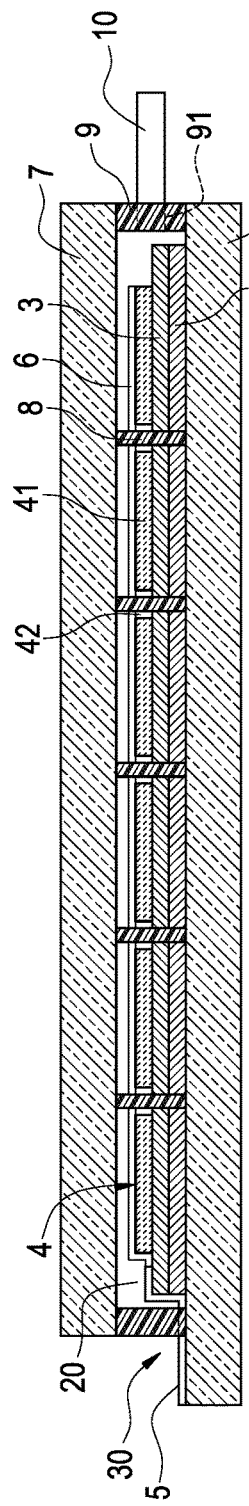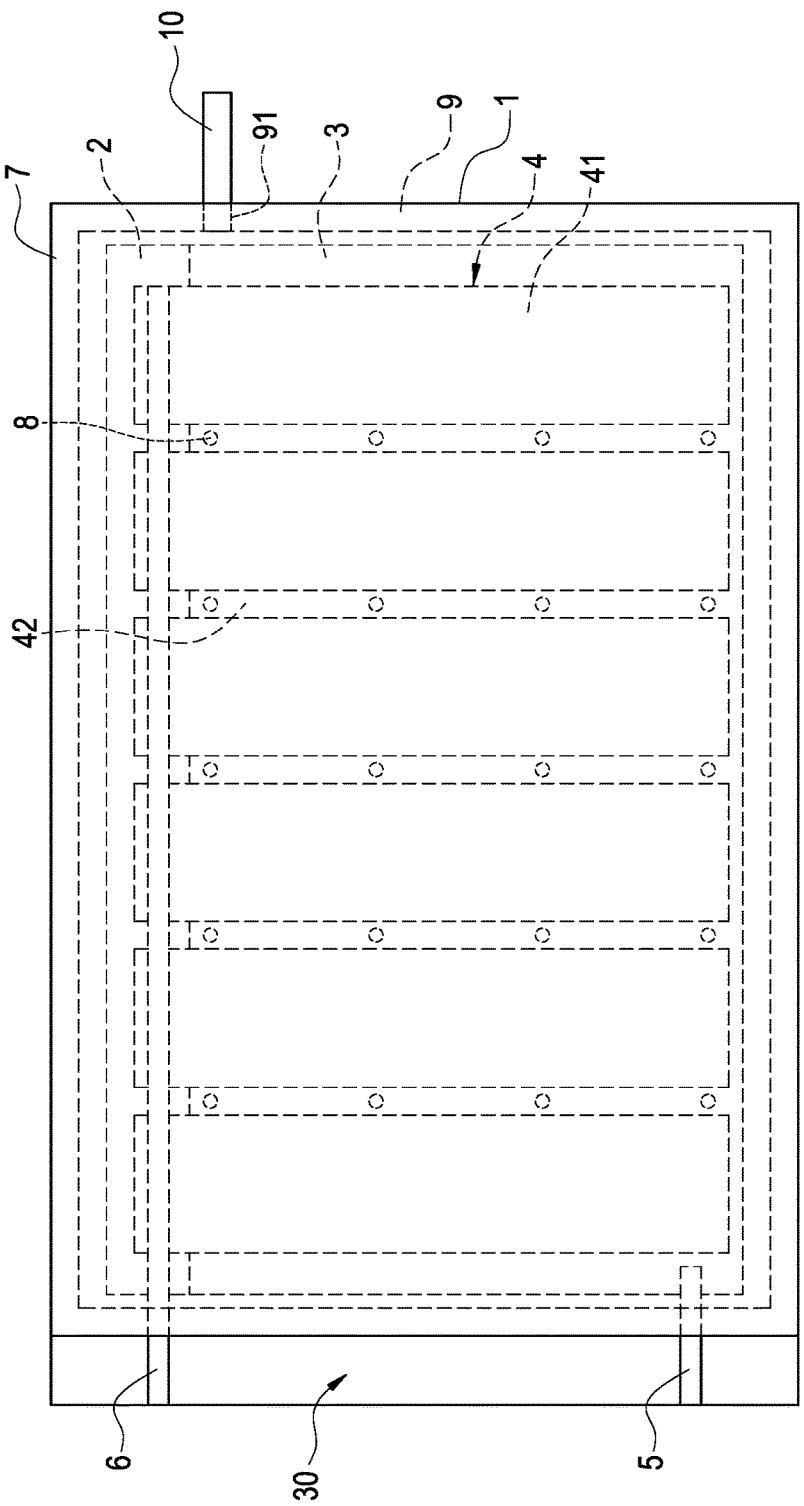

SOLAR CELL HERMETIC PACKAGE STRUCTURE

BACKGROUND OF THE INVENTION

Field of the Invention

The present invention relates to a solar cell package structure, and especially relates to a solar cell hermetic package structure.

Description of the Related Art

With the increase of the requirement of the energy conservation and environment protection for the energy and the continuous development of the solar energy utilization technology, the solar cell can be combined with the consumer goods. Ranging from the charging requirement of the 3C products and the portable products to the utilization of the electricity collection of the buildings, namely, the general consumer goods and the leisure goods and so on, the match with the solar cell can be seen/found at any time, to fully utilize the solar energy to achieve the purpose of the green energy and the power saving.

Recently, a new thin film solar cell (for examples, the organic solar cell, CIGS, or PSC solar cell) provides the technical means to manufacture and prepare the light and slim solar cell by the evaporation, coating technology and so on; the advantage is that the solar cell has better smoothness and uniformity. The R2R process provides the thin film solar cell with the large area manufacture and preparation. Therefore, the new solar cell with the plasticity, light weight and impact resistance can be manufactured under/with the lower cost. Moreover, different from the conventional single-crystal silicon or multi-crystal silicon solar cell structure, the thin film solar cell structure is lighter and slimmer.

Based on the requirement of the light and slim structure, the related art solar substrate often utilizes the plastics, for examples, the soft barrier film to proceed the pasting and packaging in the packaging operation. However, the material mentioned above still has the limitations of the structure lifetime and environment use. Moreover, the soft barrier film will utilize the areas of the surrounding invalid edges to proceed the pasting and packaging to just achieve the effective effect of the gas barrier packaging.

Considering the glass packaging, especially the hermetic glass packaging technology proceeding the solar substrate packaging, the structure, the effect of strengthening and gaining the lifetime of the solar cell and the utilization of the effective surfaces of the structure, should be improved. Especially, in recent years, a related art laser heating technology can hot melt the glass by the high temperature in a small area; the packaging of the partial glass area is applied; the vacuum degree after being packaged can achieve above $10^{-1}$ torr.

Therefore, the inventor considers the improvement of the related art laser packaging technology mentioned above; based on the related experiences of working on this issue for years, the inventor carefully observes and researches and applies with the theory, to provide a reasonable design and the effective present invention.

SUMMARY OF THE INVENTION

Therefore, the main object of the present invention is to provide a new solar cell hermetic package structure. The glass substrate is combined with specific and allocated dividers (spacers or ribs) in the solar cell hermetic package structure to proceed the hermetic package. The hermetic package can be proceeded without breaking the solar substrate structure. Therefore, the solar cell which is provided can increase the lifetime in the structure. The appearance structure of the glass has the strengthening effect to more facilitate to apply to the diversified market requirements, especially, for example, the combination with the building materials.

In order to achieve the object mentioned above, the present invention provides a solar cell hermetic package structure comprising a lower-cover plate, a conductive layer, a photovoltaic layer, a lower-electrode lead, an upper-electrode lead, an upper-cover plate, a border and a plurality of dividers. The conductive layer is arranged on one side of the lower-cover plate. The photovoltaic layer is arranged on one side of the conductive layer. The photovoltaic layer is composed of a plurality of photovoltaic components; namely, the photovoltaic layer comprises a plurality of photovoltaic components. A plurality of gaps is defined between/by the photovoltaic components. The lower-electrode lead is arranged on the lower-cover plate and is electrically connected to the conductive layer. The upper-electrode lead is arranged on the lower-cover plate and is electrically connected to the photovoltaic components of the photovoltaic layer. The upper-cover plate is arranged above/on the photovoltaic layer. The border is arranged on edges of corresponding sides of the lower-cover plate and the upper-cover plate. The dividers are arranged on one side of the upper-cover plate and are arranged in the gaps which are defined between/by the photovoltaic components. Moreover, after the upper-cover plate and the lower-cover plate are combined, the photovoltaic layer is arranged in a hermetic package structure between the upper-cover plate and the lower-cover plate. The border forms a hermetic area; more specifically, the upper-cover plate, the lower-cover plate and the border form a hermetic area. The hermetic area accommodates the photovoltaic layer, so that the dividers are arranged in the gaps which are defined between/by the photovoltaic components. The dividers are used as supports between the upper-cover plate and the lower-cover plate.

In an embodiment of the present invention, the upper-cover plate and the lower-cover plate are glass substrates.

In an embodiment of the present invention, the glass substrates are composed of tempered (semi-tempered) clear/white glasses, sunlight (solar light) control coated glasses, low-e glasses and so on.

In an embodiment of the present invention, thicknesses of the upper-cover plate and the lower-cover plate are between 0.5 mm-20 mm.

In an embodiment of the present invention, the conductive layer is a plurality of transparent electrode circuits made of inorganic conductor materials.

In an embodiment of the present invention, widths of the gaps which are defined between/by the photovoltaic components are above 10 μm.

In an embodiment of the present invention, the widths of the gaps which are defined between/by the photovoltaic components are between 50 μm-100 μm.

In an embodiment of the present invention, each of the photovoltaic components comprises and is composed of an electron transport layer, an active layer and an electron hole transport layer structure in sequence.

In an embodiment of the present invention, each of the photovoltaic components is an organic solar cell, a copper indium gallium selenide (CIGS) thin film solar cell, a cadmium telluride (CdTe) thin film solar cell, a silicon (α-Si) thin film solar cell, a perovskite thin film solar cell, or a dye sensitized solar cell (DSSC).

In an embodiment of the present invention, the upper-electrode lead and the lower-electrode lead are copper foils, copper wires (copper lines) or silver pastes arranged on one side of the lower-cover plate, and are electrically connected to the photovoltaic components and the conductive layer. The upper-electrode lead and the lower-electrode lead are electrically connected to an anode and a cathode of the photovoltaic layer to provide an external electrical connection.

In an embodiment of the present invention, thicknesses of the dividers are between 5 μm-100 μm.

In an embodiment of the present invention, the dividers are ribs (barrier ribs) or spacers (spacer sheets).

In an embodiment of the present invention, the ribs or the spacers are glass pastes, glass granules, or the glass granules with/touching the glass pastes.

In an embodiment of the present invention, the border is a glass paste, a glass strip, or the glass strip with/touching the glass paste.

In an embodiment of the present invention, an opening is defined in/by the border. An exhaust tube is arranged in/on the opening.

In an embodiment of the present invention, a vacuum degree of the hermetic area is between $10^{-1}$-$10^{-7}$ torr.

In an embodiment of the present invention, a getter ring is arranged in the hermetic area to accommodate a getter material.

In an embodiment of the present invention, the upper-cover plate or the lower-cover plate provides a partial area as an exposed area to be used as a non-hermetic area to arrange the upper-electrode lead and the lower-electrode lead.

In an embodiment of the present invention, the hermetic area is filled with a dry air, a nitrogen, an inert gas, or a mixed gas comprising the dry air, the nitrogen and the inert gas.

In an embodiment of the present invention, a substrate is arranged between the lower-cover plate and the conductive layer.

In an embodiment of the present invention, the substrate is a diaphanous/euphotic/translucent plastic or a diaphanous/euphotic/translucent glass substrate.

In an embodiment of the present invention, the diaphanous/euphotic/translucent plastic is a polyimide (PI), a hybrid PI, a polyethylene terephthalate (PET), a polyether sulfone (PES), a polyethylene naphthalate (PEN), a cyclo olefin polymer (COP), or a fiberglass reinforced plastic substrate.

BRIEF DESCRIPTION OF DRAWINGS

FIG. 1 shows a first embodiment of the solar cell structure of the present invention.

FIG. 2 shows a top view of FIG. 1.

FIG. 3 shows the first embodiment of the hermetic package structure.

FIG. 4 shows a top view of FIG. 3.

FIG. 5 shows a side view of a combination of the first embodiment of the solar cell structure and the hermetic package structure of the present invention.

FIG. 6 shows a top view of FIG. 5.

DETAILED DESCRIPTION OF THE INVENTION

Figure 7:
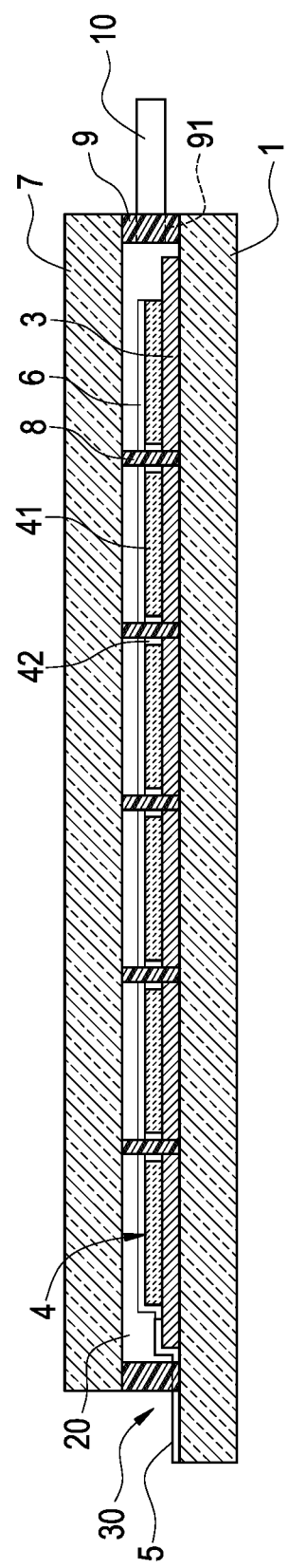
FIG. 7 shows a second embodiment of the solar cell structure of the present invention.

Now the technical contents and detailed descriptions of the present invention are described as following with figures.

FIG. 1 shows a first embodiment of the solar cell structure of the present invention. FIG. 2 shows a top view of FIG. 1. As shown in FIG. 1 and FIG. 2, the solar cell hermetic package structure of the present invention comprises a lower-cover plate 1, a substrate 2, a conductive layer 3, a photovoltaic layer 4, a lower-electrode lead 5 and an upper-electrode lead 6.

The lower-cover plate 1 is a glass substrate. The glass substrate is composed of a tempered (semi-tempered) clear/white glass, a sunlight (solar light) control coated glass, a low-e glass and so on. In FIG. 1 and FIG. 2, a thickness of the lower-cover plate 1 is between 0.5 mm-20 mm.

The substrate 2 is arranged on one side of the lower-cover plate 1. The substrate 2 is a diaphanous/euphotic/translucent plastic or a diaphanous/euphotic/translucent glass substrate. The diaphanous/euphotic/translucent plastic is a polyimide (PI), a hybrid PI, a polyethylene terephthalate (PET), a polyether sulfone (PES), a polyethylene naphthalate (PEN), a cyclo olefin polymer (COP), or a fiberglass reinforced plastic substrate.

The conductive layer 3 is arranged on one side of the substrate 2. The conductive layer 3 can comprise a plurality of transparent electrode circuits (not shown in figures) which is formed by the etching technology comprising inorganic conductor materials. In FIG. 1 and FIG. 2, the inorganic conductor materials are indium tin oxide or/and silver pastes The photovoltaic layer 4 is manufactured and arranged on one side of the conductive layer 3. The photovoltaic layer 4 is composed of a plurality of photovoltaic components 41; namely, the photovoltaic layer 4 comprises a plurality of photovoltaic components 41. A plurality of gaps 42 is defined between/by the photovoltaic components 41, wherein widths of the gaps 42 are above 10 μm, for example, between 50 μm-100 μm. Each of the photovoltaic components 41 comprises and is composed of an electron transport layer, an active layer and an electron hole transport layer structure in sequence. In FIG. 1 and FIG. 2, the photovoltaic component 41 is an organic solar cell, a copper indium gallium selenide (CIGS) thin film solar cell, a cadmium telluride (CdTe) thin film solar cell, a silicon (α-Si) thin film solar cell, a perovskite thin film solar cell, or a dye sensitized solar cell (DSSC).

The lower-electrode lead 5 is arranged on one side of the lower-cover plate 1 by printing with a copper foil, a copper wire (a copper line) or a silver paste, and is electrically connected to the conductive layer 3.

The upper-electrode lead 6 is arranged on one side of the lower-cover plate 1 by printing with a copper foil, a copper wire (a copper line) or a silver paste, and is electrically connected to the photovoltaic layer 4. The upper-electrode lead 6 and the lower-electrode lead 5 are electrically connected to an anode and a cathode of the photovoltaic layer 4 to provide an external electrical connection.

FIG. 3 shows the first embodiment of the hermetic package structure. FIG. 4 shows a top view of FIG. 3. The hermetic package structure of the present invention comprises an upper-cover plate 7, a plurality of dividers 8, a border 9 and an exhaust tube 10.

The upper-cover plate 7 is a glass substrate. The glass substrate is composed of a tempered (semi-tempered) clear/white glass, a sunlight (solar light) control coated glass, a low-e glass and so on. In FIG. 3 and FIG. 4, a thickness of the upper-cover plate 7 is between 0.5 mm-20 mm.

The dividers 8 are arranged on the upper-cover plate 7 and are in the interval configuration and are correspondingly arranged to the gaps 42 which are defined between/by the photovoltaic components 41. The dividers 8 can be attached on one side of the upper-cover plate 7 by baking with the array arrangement method. Thicknesses of the dividers 8 are between 5 μm-100 μm. The dividers 8 are ribs (barrier ribs) or spacers (spacer sheets). In FIG. 3 and FIG. 4, the ribs or the spacers can be shapeable glass granules with/touching glass pastes, and the laser heats to solidify to make shape, or the glass pastes are directly heated by the laser to solidify to make shape.

The border 9 is arranged on an edge of one side of the upper-cover plate 7. Moreover, the border 9 is attached to the surrounding of the upper-cover plate 7 by the glass pastes, and the border 9 is formed by firstly proceeding pre-baking. An opening 91 is defined in/by the border 9. In FIG. 3 and FIG. 4, the border 9 is a glass strip with/touching the glass pastes, and the laser heats to solidify to make shape, or the glass pastes are directly heated by the laser to solidify to make shape.

The exhaust tube 10 is arranged in/on the opening 91 which is defined in/by the border 9 on one side of the upper-cover plate 7. When the upper-cover plate 7 and the lower-cover plate 1 are combined, the exhaust tube 10 provides to proceed vacuum-pumping for the hermetic area (not shown in figures). In FIG. 3 and FIG. 4, the exhaust tube 10 is arranged on an edge of one side of the upper-cover plate 7 with the glass pastes by firstly pre-baking. After being packaged and then combined with the lower-cover plate 1 and then air exhausted, the exhaust tube 10 is sintered to proceed to seal up to form the vacuum of the hermetic area.

FIG. 5 shows a side view of a combination of the first embodiment of the solar cell structure and the hermetic package structure of the present invention. FIG. 6 shows a top view of FIG. 5. As shown in FIG. 5 and FIG. 6, the present invention utilizes the lower-cover plate 1 that the thickness is 0.7 mm to attach the lower-cover plate 1 to the photovoltaic layer 4, and arranges the upper-electrode lead 6 and the lower-electrode lead 5, or the lower-cover plate 1 having the conductive layer 3 is directly selected and the photovoltaic layer 4 is directly manufactured on the conductive layer 3, wherein the photovoltaic layer 4 is composed of a plurality of photovoltaic components 41, and necessary gaps 42 are defined/maintained between the photovoltaic components; the widths of the gaps 42 are between 50 μm-100 μm as mentioned above.

Then, the border 9 that the thickness is 150 μm is arranged on an edge of the upper-cover plate 7 by the injecting glues method, wherein the thickness of the upper-cover plate 7 is 0.7 mm. The exhaust tube 10 and the opening 91 are manufactured/defined on one side of the border 9. A surface of the upper-cover plate 7 is coated/covered with dot glass pastes that thickness is 100 μm and which are the ribs or the pasted spacers forming the dividers 8 in the dot form distribution by the injecting glues method. After that, firstly make the border 9, the opening 91 and the dividers 8 make shape by the baking/drying method.

Then, proceed the hermetic package for the upper-cover plate 7, the lower-cover plate 1 and the photovoltaic layer 4. The glass pastes of the border 9 and the areas of the glass pastes tightly contacting the exhaust tube 10 are proceeded to be heated and welded by the partially laser heating method. After that, the exhaust tube 10 further proceeds the air exhaustion, so that the vacuum $10^{-4}$ torr is formed in the hermetic area 20 of the hermetic package structure of the present invention. The exhaust tube 10 is proceeded to be sealed up to finish the hermetic structure by the laser partially heating technology, so that the solar energy hermetic package structure of the present invention is achieved. In FIG. 5 and FIG. 6, the vacuum degree of the hermetic area 20 is between $10^{-1}$-$10^{-7}$ torr. Moreover, a getter ring accommodating a getter material is arranged in the hermetic area 20 to benefit the maintenance of the vacuum degree of the hermetic area 20.

After the upper-cover plate 7 and the lower-cover plate 1 are packaged, the photovoltaic layer 4 is arranged in the hermetic package structure; the border 9 forms a hermetic area 20; more specifically, the upper-cover plate 7, the lower-cover plate 1 and the border 9 form a hermetic area 20. The hermetic area 20 accommodates the photovoltaic layer 4. The dividers 8 are arranged in the gaps 42 which are defined between/by the photovoltaic components 41. The dividers 8 are used as supports between the upper-cover plate 7 and the lower-cover plate 1.

Moreover, the upper-cover plate 7 or the lower-cover plate 1 mentioned above can provide a partial area as an exposed area to be used as a non-hermetic area 30 to arrange the upper-electrode lead 6 and the lower-electrode lead 5.

Moreover, a getter ring can be arranged in the hermetic area 20 to gain the vacuum lifetime maintenance.

Moreover, for the nitrogen hermetic package, the difference from the first embodiment is that the exhaust tube 10 is not necessary to be arranged on the upper-cover plate 7. The upper-cover plate 7 and the lower-cover plate 1 can be proceeded the laser package in the nitrogen atmosphere environment (for example, the nitrogen box) so that 99% nitrogen hermetic status is achieved in the hermetic area 20; or, the hermetic area 20 can be filled with dry air, nitrogen, inert gas, or mixed gas comprising dry air, nitrogen and inert gas.

FIG. 7 shows a second embodiment of the solar cell structure of the present invention. As shown in FIG. 7, the second embodiment of the present invention is basically similar with the first embodiment. The difference is that the conductive layer 3 is directly manufactured on one side of the lower-cover plate 1. Then, the photovoltaic layer 4 is manufactured on one side of the conductive layer 3, so that the solar cell structure is manufactured more easily and simply, so that the manufacturing cost is reducing.

The present invention can be arranged on/in/at various locations/apparatuses, for example but not limited to, cabinets, windows, doors, tables, walls, heat preservation apparatuses, cold preservation apparatuses, glasses of doors/windows of baking apparatuses. However, the doors mentioned above are generalized doors, but are not limited to doors of the residences/houses; the doors mentioned above can be car doors, doors of refrigerators (cold preservation apparatuses) or doors of ovens (baking apparatuses), so that the present invention is arranged on the doors and/or the baking apparatuses. Moreover, the glass substrates of the upper-cover plate 7 and the lower-cover plate 1 can be composed of tempered (semi-tempered) clear/white glasses, sunlight (solar light) control coated glasses, low-e glasses and so on, which have the ultra-low heat-transfer coefficient and the higher sound insulation performance. The hermetic area 20 can be filled with air, inert gas, or mixed gas comprising air and inert gas to further reduce the heat-transfer coefficient of the assembly, increase the thermal insulation effect and/or maintain to provide to have the product lifetime stabilization, waterproof, weather resistance, durability, and/or lower heat-transfer coefficient, to provide the combination applications of home appliances, 3C applications, building walls and/or windows, and to provide the electricity generation utilization of the solar energy.

Summing up the above, the solar cell hermetic glass package structure of the present invention can combine with buildings, home decoration appliances, and/or household appliances to form solar cell hermetic glass package products, to provide an application which is able to supply power wirelessly, be waterproof, have heat preservation performance and/or have sound insulation performance. On the basis combining with the present invention, the intensity of the glass and the safe reliability, durability and weather resistance of the system is further improved.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A solar cell hermetic package structure comprising:
a lower-cover plate;
a conductive layer arranged on a surface of the lower-cover plate;
a photovoltaic layer arranged on a surface of the conductive layer and comprising a plurality of photovoltaic components, a plurality of gaps defined between the photovoltaic components;
a lower-electrode lead arranged on the lower-cover plate and electrically connected to the conductive layer;
an upper-electrode lead arranged on the lower-cover plate and electrically connected to the photovoltaic components of the photovoltaic layer;
an upper-cover plate arranged above the photovoltaic layer;
a border arranged on edges of corresponding sides of the lower-cover plate and the upper-cover plate; and
a plurality of dividers arranged on a surface of the upper-cover plate and arranged in the gaps defined between the photovoltaic components,
wherein the photovoltaic layer is arranged in a hermetic package structure between the upper-cover plate and the lower-cover plate; the upper-cover plate, the lower-cover plate and the border form a hermetic area; the hermetic area accommodates the photovoltaic layer, so that the dividers are arranged in the gaps defined between the photovoltaic components; the dividers are used as supports between the upper-cover plate and the lower-cover plate; and
wherein the conductive layer has a plurality of transparent electrode circuits made of inorganic conductor materials.

2. The solar cell hermetic package structure in claim 1, wherein the upper-cover plate and the lower-cover plate are glass substrates.

3. The solar cell hermetic package structure in claim 2, wherein the glass substrates are composed of tempered/semi-tempered white glasses, sunlight control coated glasses and low-e glasses.

4. The solar cell hermetic package structure in claim 1, wherein thicknesses of the upper-cover plate and the lower-cover plate are between 0.5 mm-20 mm.

5. The solar cell hermetic package structure in claim 1, wherein widths of the gaps defined between the photovoltaic components are above 10 μm.

6. The solar cell hermetic package structure in claim 5, wherein the widths of the gaps defined between the photovoltaic components are between 50 μm-100 μm.

7. The solar cell hermetic package structure in claim 1, wherein each of the photovoltaic components comprises and is composed of an electron transport layer, an active layer and hole transport layer structure in sequence.

8. The solar cell hermetic package structure in claim 1, wherein each of the photovoltaic components is an organic solar cell, a copper indium gallium selenide thin film solar cell, a cadmium telluride thin film solar cell, a silicon thin film solar cell, a perovskite thin film solar cell, or a dye sensitized solar cell.

9. The solar cell hermetic package structure in claim 1, wherein the upper-electrode lead and the lower-electrode lead are copper foils, copper wires or silver pastes arranged on the surface of the lower-cover plate, and are electrically connected to the photovoltaic components and the conductive layer; the upper-electrode lead and the lower-electrode lead are electrically connected to an anode and a cathode of the photovoltaic layer to provide an external electrical connection.

10. A solar cell hermetic package structure comprising:
a lower-cover plate;
a conductive layer arranged on a surface of the lower-cover plate;
a photovoltaic layer arranged on a surface of the conductive layer and comprising a plurality of photovoltaic components, a plurality of gaps defined between the photovoltaic components;
a lower-electrode lead arranged on the lower-cover plate and electrically connected to the conductive layer;
an upper-electrode lead arranged on the lower-cover plate and electrically connected to the photovoltaic components of the photovoltaic layer;
an upper-cover plate arranged above the photovoltaic layer;
a border arranged on edges of corresponding sides of the lower-cover plate and the upper-cover plate; and
a plurality of dividers arranged on a surface of the upper-cover plate and arranged in the gaps defined between the photovoltaic components,
wherein the photovoltaic layer is arranged in a hermetic package structure between the upper-cover plate and the lower-cover plate; the upper-cover plate, the lower-cover plate and the border form a hermetic area; the hermetic area accommodates the photovoltaic layer, so that the dividers are arranged in the gaps defined between the photovoltaic components; the dividers are used as supports between the upper-cover plate and the lower-cover plate, and
wherein thicknesses of the dividers are between 5 μm-100 μm.

11. The solar cell hermetic package structure in claim 1, wherein the dividers are ribs or spacers.

12. The solar cell hermetic package structure in claim 11, wherein the ribs or the spacers are glass pastes, glass granules, or the glass granules with the glass pastes.

13. The solar cell hermetic package structure in claim 1, wherein the border is a glass paste, a glass strip, or the glass strip with the glass paste.

14. The solar cell hermetic package structure in claim 1, wherein an opening is defined in the border; an exhaust tube is arranged in the opening.

15. A solar cell hermetic package structure comprising:
a lower-cover plate;
a conductive layer arranged on a surface of the lower-cover plate;
a photovoltaic layer arranged on a surface of the conductive layer and comprising a plurality of photovoltaic components, a plurality of gaps defined between the photovoltaic components;
a lower-electrode lead arranged on the lower-cover plate and electrically connected to the conductive layer;
an upper-electrode lead arranged on the lower-cover plate and electrically connected to the photovoltaic components of the photovoltaic layer;
an upper-cover plate arranged above the photovoltaic layer;
a border arranged on edges of corresponding sides of the lower-cover plate and the upper-cover plate; and
a plurality of dividers arranged on a surface of the upper-cover plate and arranged in the gaps defined between the photovoltaic components,
wherein the photovoltaic layer is arranged in a hermetic package structure between the upper-cover plate and the lower-cover plate; the upper-cover plate, the lower-cover plate and the border form a hermetic area; the hermetic area accommodates the photovoltaic layer, so that the dividers are arranged in the gaps defined between the photovoltaic components; the dividers are used as supports between the upper-cover plate and the lower-cover plate, and
wherein a vacuum degree of the hermetic area is between $10^{-1}$-$10^{-7}$ torr.

16. The solar cell hermetic package structure in claim 1, wherein a getter ring is arranged in the hermetic area containing a getter material.

17. The solar cell hermetic package structure in claim 1, wherein the hermetic area is filled with a dry air, a nitrogen, an inert gas, or a mixed gas comprising the dry air, the nitrogen and the inert gas.

18. The solar cell hermetic package structure in claim 1, wherein a substrate is arranged between the lower-cover plate and the conductive layer.

19. The solar cell hermetic package structure in claim 18, wherein the substrate is a diaphanous plastic or a diaphanous glass substrate.

20. The solar cell hermetic package structure in claim 19, wherein the diaphanous plastic is a polyimide (PI), a hybrid PI, a polyethylene terephthalate, a polyether sulfone, a polyethylene naphthalate, a cyclo olefin polymer, or a fiberglass reinforced plastic substrate.

* * * * *